United States Patent
Ding et al.

(10) Patent No.: US 9,755,052 B2
(45) Date of Patent: Sep. 5, 2017

(54) PROCESS METHOD AND STRUCTURE FOR HIGH VOLTAGE MOSFETS

(71) Applicants: Yongping Ding, Sunnyvale, CA (US); Sik Lui, Sunnyvale, CA (US); Madhur Bobde, San Jose, CA (US); Lei Zhang, Sunnyvale, CA (US); Jongoh Kim, Portland, OR (US); John Chen, Palo Alto, CA (US)

(72) Inventors: Yongping Ding, Sunnyvale, CA (US); Sik Lui, Sunnyvale, CA (US); Madhur Bobde, San Jose, CA (US); Lei Zhang, Sunnyvale, CA (US); Jongoh Kim, Portland, OR (US); John Chen, Palo Alto, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/011,078

(22) Filed: Aug. 27, 2013

(65) Prior Publication Data
US 2015/0060936 A1 Mar. 5, 2015

Related U.S. Application Data

(63) Continuation-in-part of application No. 13/892,191, filed on May 10, 2013.

(51) Int. Cl.
*H01L 21/265* (2006.01)
*H01L 29/739* (2006.01)
(Continued)

(52) U.S. Cl.
CPC .. *H01L 29/66666* (2013.01); *H01L 21/26586* (2013.01); *H01L 29/0623* (2013.01);
(Continued)

(58) Field of Classification Search
CPC ... H01L 21/265; H01L 29/7393; H01L 29/78; H01L 29/7395; H01L 29/7827;
(Continued)

(56) References Cited

U.S. PATENT DOCUMENTS

2004/0075138 A1* 4/2004 Fujishima et al. ............ 257/343
2005/0258941 A1* 11/2005 Berard .......................... 340/333
(Continued)

*Primary Examiner* — Walter H Swanson
(74) *Attorney, Agent, or Firm* — Bo-In Lin

(57) ABSTRACT

A semiconductor power device disposed on a semiconductor substrate comprises a plurality of trenches formed at a top portion of the semiconductor substrate extending laterally across the semiconductor substrate along a longitudinal direction each having a nonlinear portion comprising a sidewall perpendicular to a longitudinal direction of the trench and extends vertically downward from a top surface to a trench bottom surface. The semiconductor power device further includes a trench bottom dopant region disposed below the trench bottom surface and a sidewall dopant region disposed along the perpendicular sidewall wherein the sidewall dopant region extends vertically downward along the perpendicular sidewall of the trench to reach the trench bottom dopant region and pick-up the trench bottom dopant region to the top surface of the semiconductor substrate.

18 Claims, 9 Drawing Sheets

(51) Int. Cl.
*H01L 29/78* (2006.01)
*H01L 29/66* (2006.01)
*H01L 29/06* (2006.01)
*H01L 29/40* (2006.01)
*H01L 29/10* (2006.01)

(52) U.S. Cl.
CPC ........ *H01L 29/1095* (2013.01); *H01L 29/407* (2013.01); *H01L 29/66333* (2013.01); *H01L 29/66348* (2013.01); *H01L 29/66712* (2013.01); *H01L 29/7395* (2013.01); *H01L 29/7802* (2013.01); *H01L 29/0696* (2013.01)

(58) Field of Classification Search
CPC ......... H01L 29/66348; H01L 29/66666; H01L 29/66325; H01L 29/739; H01L 29/4236; H01L 29/66704; H01L 29/66734; H01L 29/7813
USPC ......... 438/135, 270, 524; 257/139, 288, 330
See application file for complete search history.

(56) References Cited

U.S. PATENT DOCUMENTS

2010/0044791 A1* 2/2010 Hebert .......................... 257/341
2012/0187472 A1* 7/2012 Chang et al. ................. 257/328

* cited by examiner

1 – 1'

2 – 2'

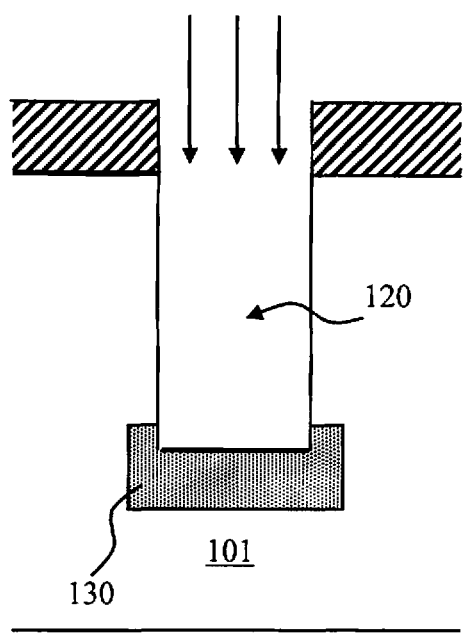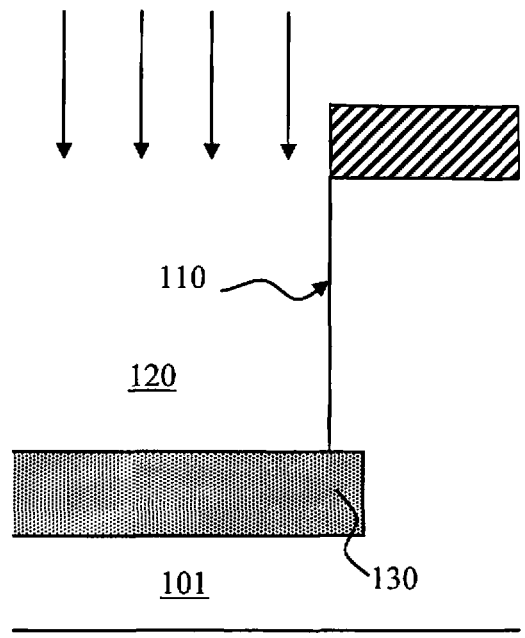
1 – 1'
FIG. 2D-1
2 – 2'
FIG. 2D-2

1 – 1'

2 – 2'

1 – 1'

2 – 2'

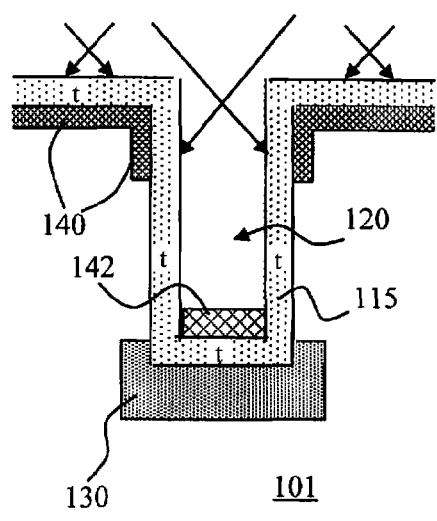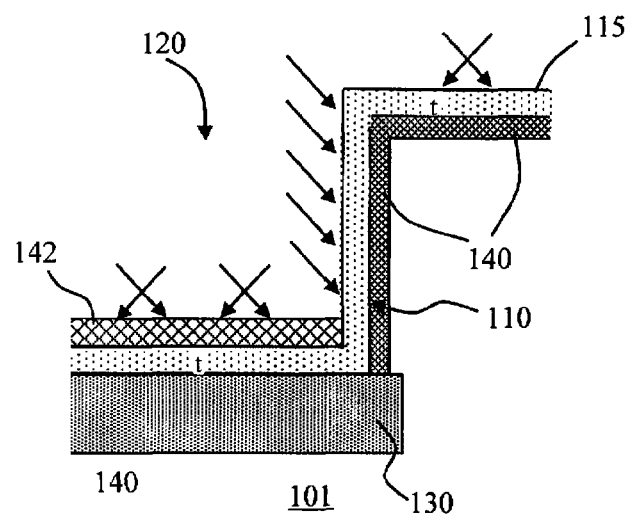
FIG. 2G-1  FIG. 2G-2
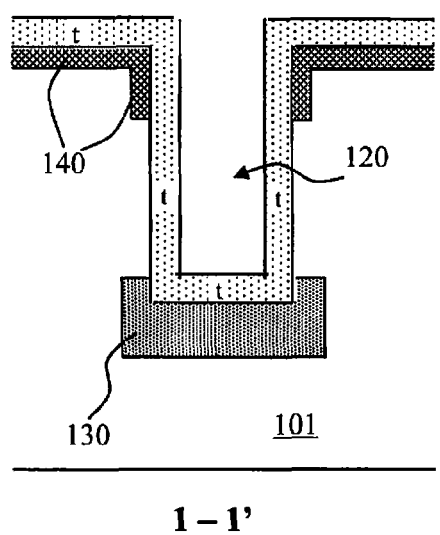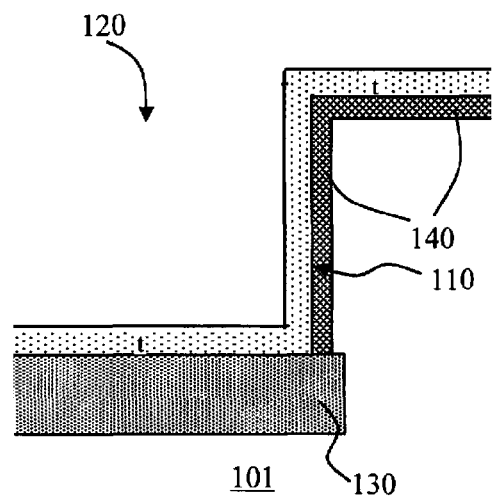
FIG. 2H-1  FIG. 2H-2

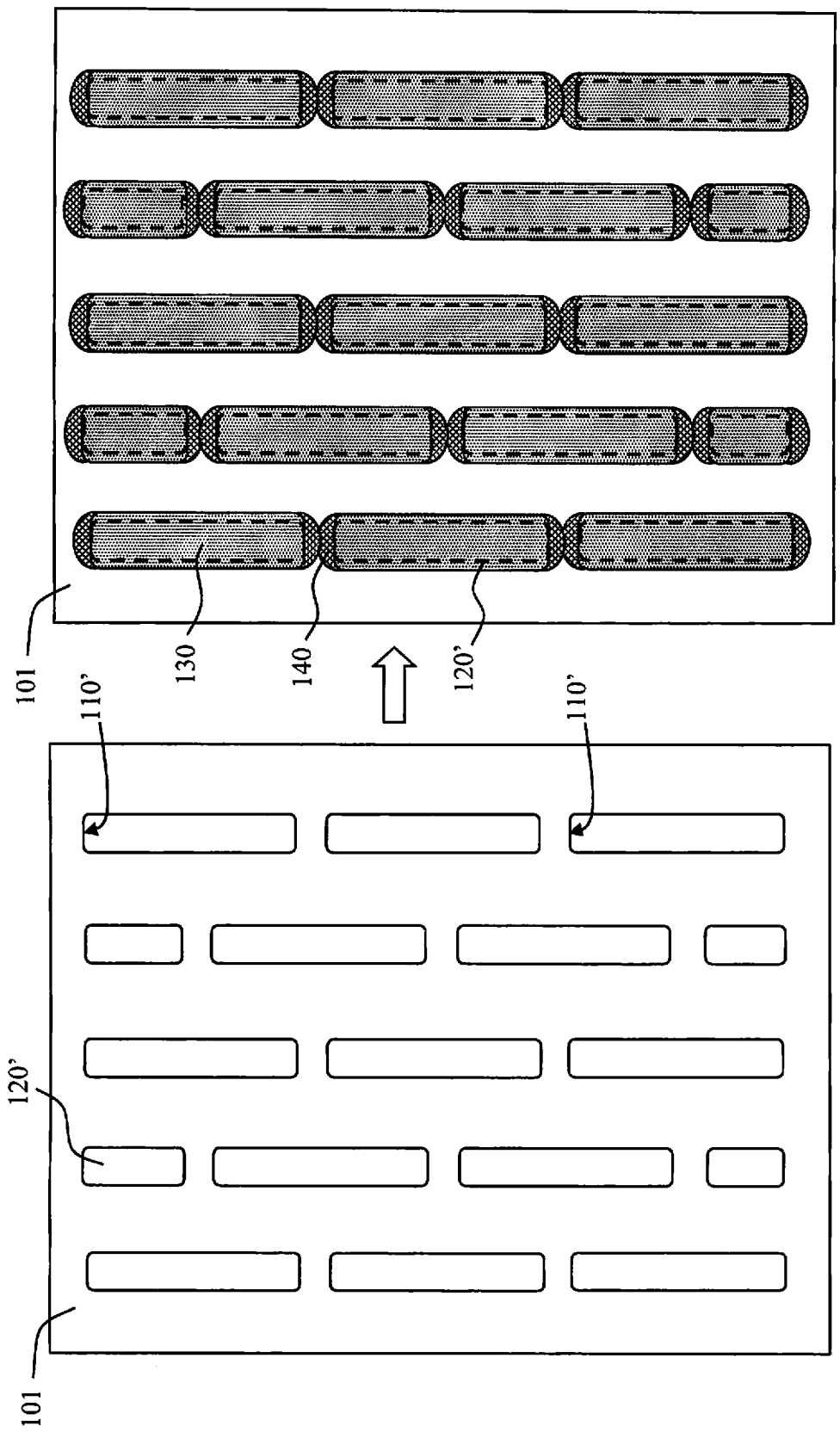

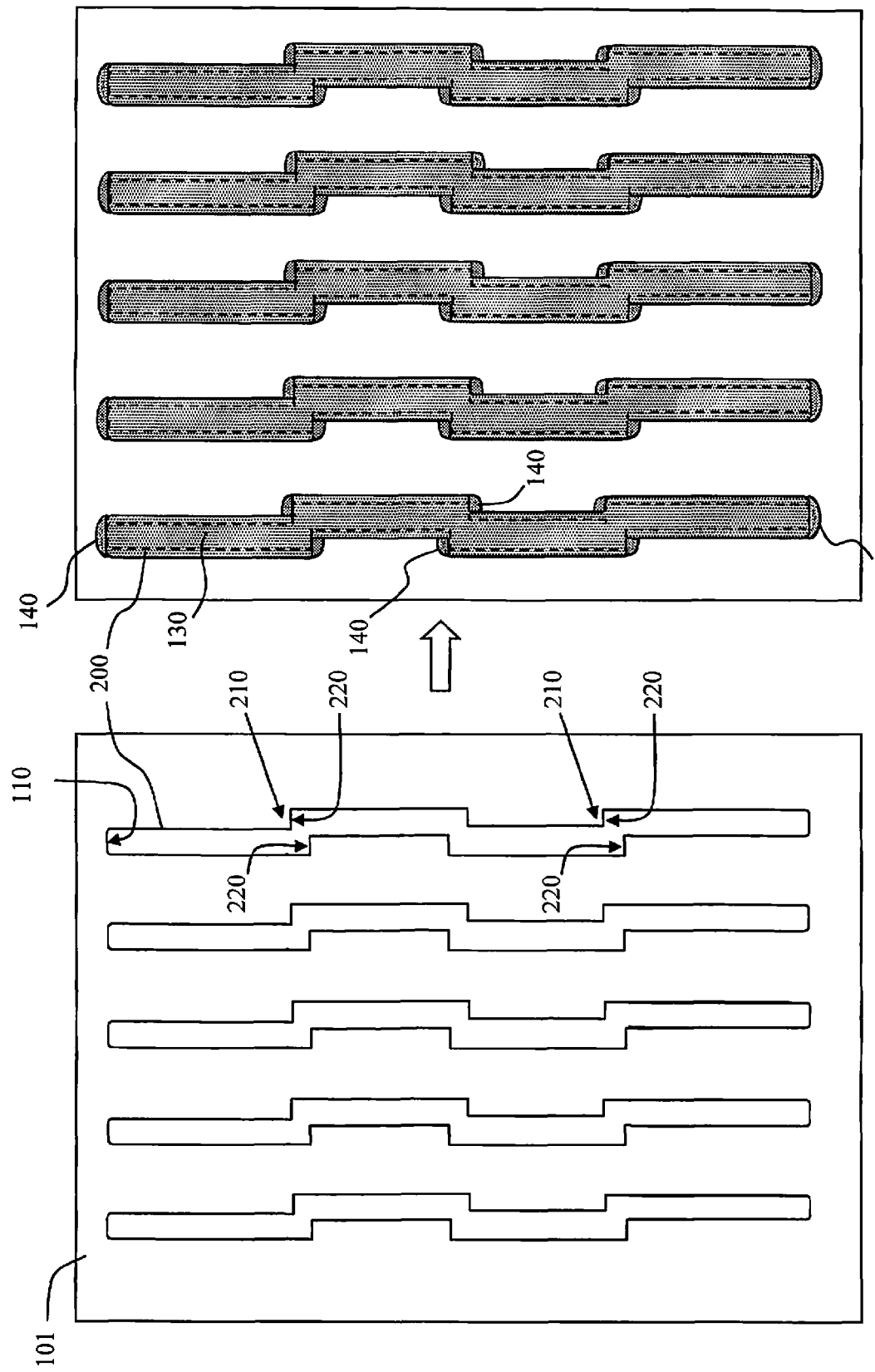

PROCESS METHOD AND STRUCTURE FOR HIGH VOLTAGE MOSFETS

CROSS REFERENCE TO OTHER APPLICATIONS

This application is a Continuation-In-Part (CIP) of and claims priority to U.S. patent application Ser. No. 13/892,191 entitled "A PROCESS METHOD AND STRUCTURE FOR HIGHVOLTAGE MOSFETS," filed May 10, 2013, which is incorporated herein by reference for all purposes.

BACKGROUND OF THE INVENTION

1. Field of the Invention

The invention relates generally to the manufacturing processes and structures of semiconductor power devices. More particularly, this invention relates to simplified manufacturing processes and structural configurations of improved high voltage (HV) metal oxide semiconductor field effect transistors (MOSFET).

2. Description of the Prior Art

Conventional methods of manufacturing high voltage (HV) MOSFET devices are encountered with difficulties and limitations to further improve the performances due to different tradeoffs. In the vertical semiconductor power devices, there is a tradeoff between the drain to source resistance, i.e., on-state resistance, commonly represented by RdsA, i.e., Rds×Active Area, as a performance characteristic, and the breakdown voltage sustainable of the power device. Several device configurations have been explored in order to resolve the difficulties and limitations caused by these performance tradeoffs. Special P-composition (PCOM) structures are developed particularly to achieve these purposes. Specifically, the high voltage (HV) MOSFET devices implemented with the PCOM configurations include P-type dopant regions surrounding the sidewalls of the shielding trenches to link between the P-type body region formed at the top surface of the semiconductor substrate and a P-type dopant region below the shielding trenches. In order to form the sidewall dopant regions surrounding the trench sidewalls, the conventional methods apply an additional implanting mask with implanting openings to carry out the implantation processes on the trench sidewalls at the selected locations of the shielding trenches. Furthermore, in order to assure the dopant ions are implanted into the bottom portions of the trench sidewalls, implantations of dopant ions at high energy must be applied. The requirements of additional mask and the processes of applying high energy dopant ions cause the increase of the manufacturing costs. Additionally, high energy implantations into the bottom portions of the trench sidewalls followed with a diffusion process generally have less control of the formation of the dopant regions. These uncertainties of the manufacturing processes result in greater variations of device performance and less accurate control of the manufacturing qualities.

FIG. 1A is a top view of an implanting mask 100 used in the conventional process and FIGS. 1B and 1C are two cross sectional views illustrating the configurations of a high voltage (HV) MOSFET device formed by applying conventional process along lines 1-1' and 2-2' of FIG. 1A correspondingly. As shown in FIG. 1A, the implanting openings 11 are located on the selected regions of the trenches 12. In order to form a MOSFET device that can sustain high power operations, a PCOM (P-composition) configuration is formed. In this PCOM MOSFET structure, special dopant regions are formed in part of the areas 16 below the P-type body region 13 through the implanting openings 11 to link the P-type body region and a P-type dopant region 15 below the trench 12 as shown in FIG. 1C. Meanwhile, in other areas, the implantation forming the dopant regions below the body regions is blocked by the implanting mask 100. The implant mask shown in FIG. 1A blocks the dopant implanted through the sidewalls of the trench in areas around 1-1'. FIG. 1B shows a configuration where there are no dopant regions surrounding the trench sidewalls to link the body regions and the dopant regions below the trench bottom. As shown in FIGS. 1B-1C, the high voltage (HV) MOSFET device also includes a planar gate 17 formed atop the semiconductor substrate and a source 18 and a P++ contact 19 formed at a top portion of the P-type body region 13.

The conventional manufacturing processes as shown in FIGS. 1A to 1C requires an additional implanting mask. Furthermore, a high energy implant of P-type dopant, e.g., P-type dopant implant in the Mev ranges, is required to form the dopant regions below the body regions surrounding the trench sidewalls shown in FIG. 1C. The manufacturing costs are increased due to the additional Mask and high energy implant requirements.

Therefore, a need still exists for the ordinary skill in the art to improve the methods of manufacturing of the power devices, particularly the devices with the PCOM configuration to resolve these technical limitations. It is the purpose of this invention to provide new and improved methods of manufacturing and device configurations to eliminate the requirements of additional implanting mask and high energy implantations such that the above-discussed difficulties and limitations can be overcome.

SUMMARY OF THE PRESENT INVENTION

It is therefore an aspect of the present invention to provide a new and improved method of manufacturing for implanting the trench sidewall P-type dopant regions without requiring an additional implanting mask and without requiring a high energy dopant implant such that the cost of manufacturing can be reduced, whereby the above discussed limitations and difficulties can be resolved.

Specifically, it is an aspect of this invention that the implanting process takes advantage of the special configuration of the sidewalls at the trench endpoints where the sidewall perpendicular to the longitudinal direction of the trench is inherently exposed to open space as part of the trenches. Therefore, a P-type dopant region implanted through this endpoint sidewall can be carried out to reach the bottom P-type dopant region formed at the bottom of the trench without requiring the application of high energy dopant ions because the dopant ions are projected only through open space of the trenches without requiring penetrating through the semiconductor substrate. The PCOM dopant regions linking the P-type body regions formed at the top surface of the semiconductor substrate and the trench bottom P-type dopant regions are therefore formed only at the sidewalls of the trench endpoint. In contrast to the conventional methods, cost savings are achieved without requiring a high energy dopant implant.

In addition, it is an aspect of this invention that the implanting process takes advantage of the special configuration of the trench sidewalls at the trench bends where the sidewall perpendicular to the longitudinal direction of the trench is inherently exposed to open space as part of the trenches. Furthermore, it is an aspect of this invention that the implanting process takes advantage of the special configuration of the trench sidewalls at the trench notches where the sidewall perpendicular to the longitudinal direction of the trench is inherently exposed to open space as part of the trenches. Therefore, a P-type dopant region implanted through this sidewall can be carried out to reach the bottom P-type dopant region formed at the bottom of the trench without requiring the application of high energy dopant ions because the dopant ions are projected only through open space of the trenches without requiring penetrating through the semiconductor substrate.

It is another aspect of this invention that the sidewall dopant implant through the open space along the longitudinal direction of the trench onto a trench sidewall at the trench endpoint, trench bend and trench notch provides better control over the implanting process. The device performance parameters are more accurately controllable and manufacturing variations caused by uncertainties due to high energy dopant implant to penetrate through substrate are reduced.

In a preferred embodiment, this invention discloses a semiconductor power device disposed in a semiconductor substrate. The semiconductor power device comprises a plurality of shielding trenches formed at the top portion of the semiconductor substrate each having a trench endpoint with an endpoint sidewall perpendicular to a longitudinal direction of the trench and extends vertically downward from a top surface to a trench bottom surface. The semiconductor power device further includes a trench bottom P-type dopant region disposed below the trench bottom surface and a sidewall P-type dopant region disposed along the endpoint sidewall wherein the sidewall P-type dopant region extends vertically downward along the endpoint sidewall of the trench to reach the trench bottom P-type dopant region and connect the trench bottom P-type dopant region to a P-type body region formed at the top surface of the semiconductor substrate.

In another preferred embodiment, this invention discloses a semiconductor power device disposed in a semiconductor substrate. The semiconductor power device comprises a plurality of shielding trenches formed at the top portion of the semiconductor substrate each having a plurality of small bends in predesigned areas with trench sidewalls perpendicular to a longitudinal direction of the trench and extends vertically downward from a top surface to a trench bottom surface. The semiconductor power device further includes a trench bottom P-type dopant region disposed below the trench bottom surface and a sidewall P-type dopant region disposed along the bend sidewall wherein the sidewall P-type dopant region extends vertically downward along the bend sidewall of the trench to reach the trench bottom P-type dopant region and connect the trench bottom P-type dopant region to a P-type body region formed at the top surface of the semiconductor substrate.

In another preferred embodiment, this invention discloses a semiconductor power device disposed in a semiconductor substrate. The semiconductor power device comprises a plurality of shielding trenches formed at the top portion of the semiconductor substrate each having a plurality of small notches in predesigned areas with trench sidewalls perpendicular to a longitudinal direction of the trench and extends vertically downward from a top surface to a trench bottom surface. The semiconductor power device further includes a trench bottom P-type dopant region disposed below the trench bottom surface and a sidewall P-type dopant region disposed along the notch sidewall wherein the sidewall P-type dopant region extends vertically downward along the notch sidewall of the trench to reach the trench bottom P-type dopant region and connect the trench bottom P-type dopant region to a P-type body region formed at the top surface of the semiconductor substrate.

In a preferred embodiment, this invention further discloses a method for manufacturing a semiconductor power device on a semiconductor substrate. The method includes step of a) applying a hard oxide mask atop a semiconductor substrate followed by patterning the hard oxide mask according to a pre-determined trench configuration; b) etching through the patterned hard mask to form a plurality of trenches at the top portion of the semiconductor substrate each having a trench endpoint, a small bend or a small notch with a sidewall perpendicular to a longitudinal direction of the trench and vertically extending downward from a top surface to a trench bottom surface; c) applying a vertical (zero degrees) high energy implant to form trench bottom P-type dopant regions below the trench bottom surface followed by removing the hard mask; d) growing an oxide liner atop the silicon surface at the sidewall and bottom of the trenches; and e) applying a low energy tilt implant wherein dopant ions are implanted along a designated tilt angle to form a sidewall P-type dopant region along the perpendicular sidewall, where the sidewall P-type dopant region extends vertically downward along the sidewall of the trench to reach the trench bottom P-type dopant region and connect the trench bottom P-type dopant region to a P-type body region formed at the top surface of the semiconductor substrate. In one of the embodiments, the dopant ions are implanted along a tilt angle approximately 45 degrees relative to the sidewall surfaces.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 2B, 2C-1, 2C-2, 2D-1, 2D-2, 2E-1, 2E-2 are side cross sectional views showing some steps of the process to form a PCOMP configuration at two different locations of the trench of the present invention.

FIGS. 2F-1 and 2F-2 are side cross sectional views showing an alternative embodiment of FIGS. 2B-1 and 2B-2.

FIGS. 2G-1, 2G-2, 2H-1 and 2H-2 are side cross sectional views showing another alternative embodiment of FIGS. 2E-1 and 2E-2.

FIG. 3A is a top view of an alternate configuration of trenches of various lengths on a semiconductor substrate of the present invention.

FIG. 3B is a top view of the semiconductor substrate of FIG. 3A after the vertical and tilt implantations to form a PCOMP configuration.

FIG. 4A is a top view of an alternate configuration of trenches on a semiconductor substrate where the trench has a nonlinear portion comprising small bends according to an embodiment of this invention.

FIG. 4B is a top view of the semiconductor substrate of FIG. 4B after the vertical and tilt implantations to form a PCOMP configuration.

DETAILED DESCRIPTION OF THE PREFERRED EMBODIMENTS

Figure 1A:
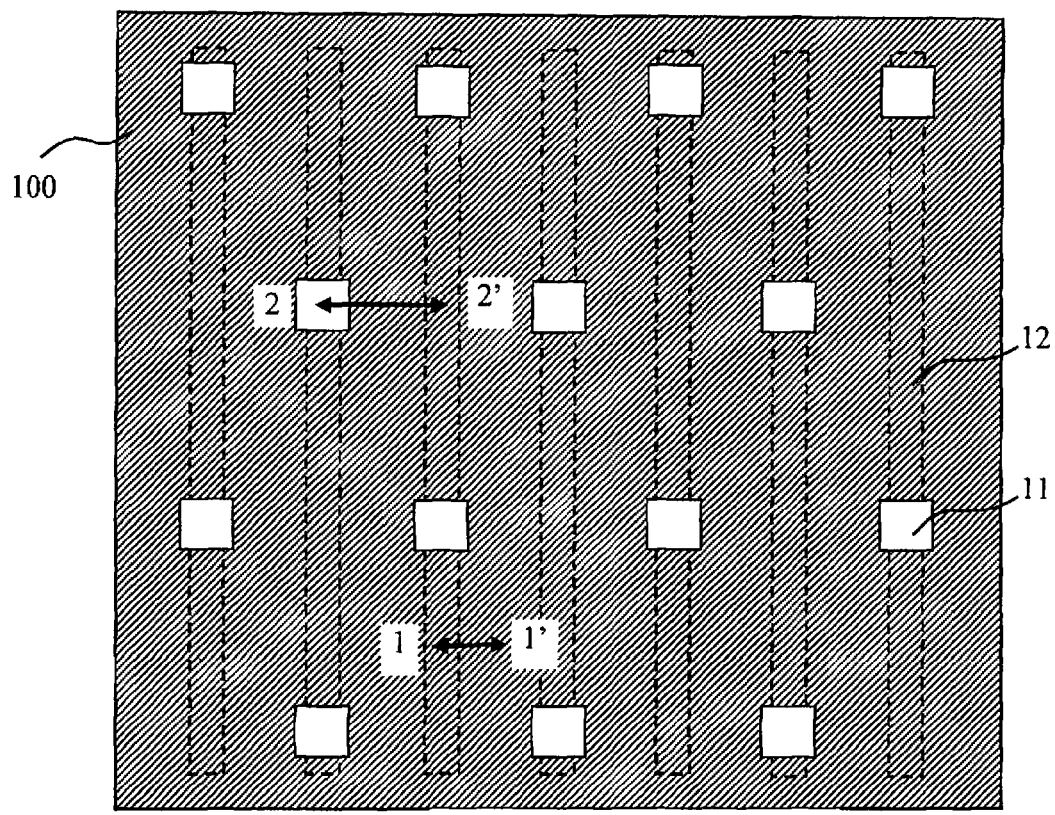
FIG. 1A is a top view of an implanting mask used in conventional process and FIGS. 1B and 1C are two side cross-sectional views of the PCOMP configurations along two different locations across the trench corresponding to those shown on the implanting mask 100 of FIG. 1A.
Figure 1B:
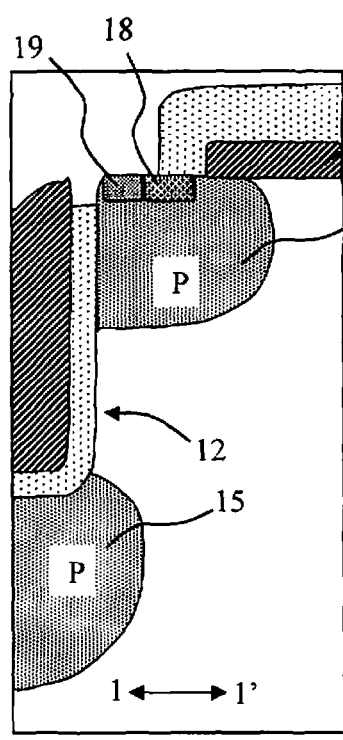
Figure 1C:
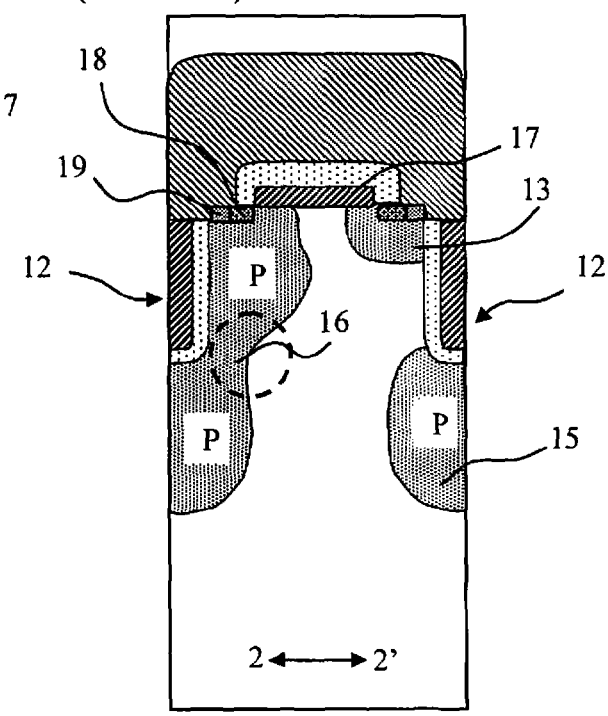
Figure 2A:
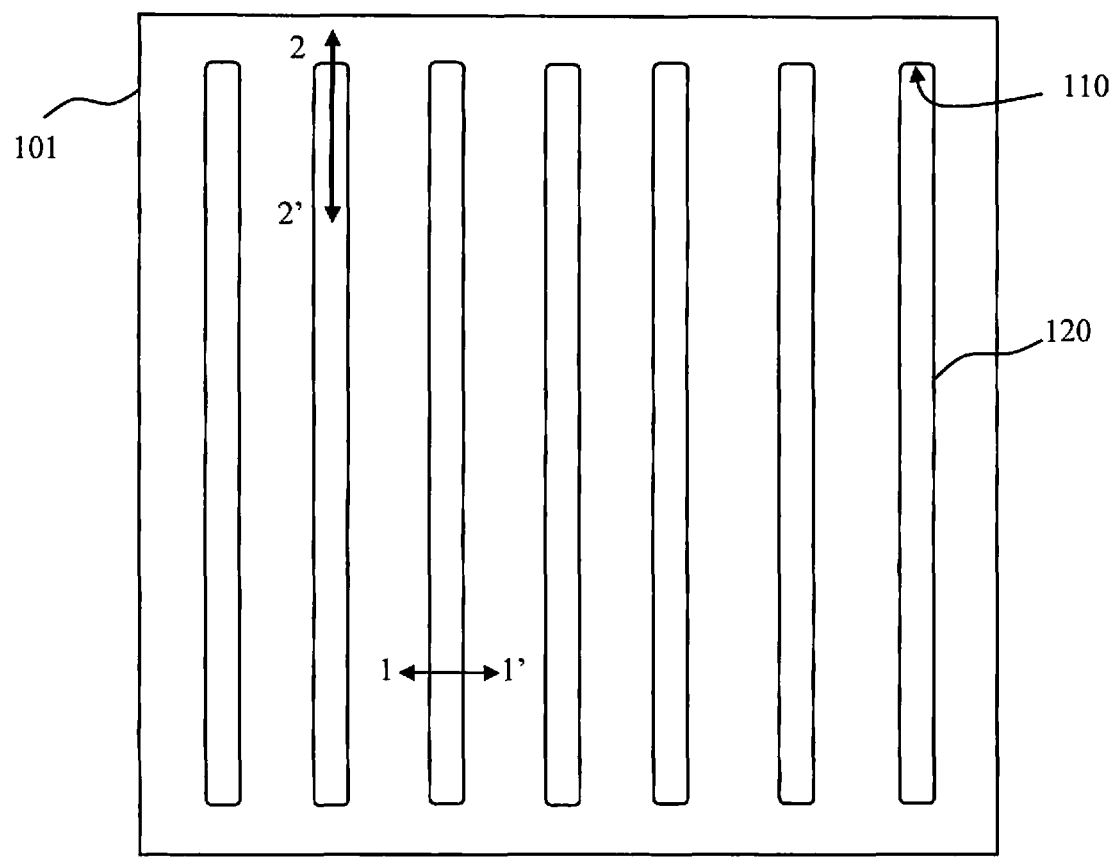
FIG. 2A is a top view of a conventional trench configuration on a semiconductor substrate.

FIG. 2A is a top view of a conventional trench configuration on a semiconductor substrate. FIGS. 2B, 2C-1, 2C-2, 2D-1, 2D-2, 2E-1, 2E-2, 2F-1, 2F-2, 2G-1, 2G-2, 2H-1 and 2H-2 are side cross sectional views illustrating the processing steps of forming the PCOM structural configuration along the line 1-1' and line 2-2' in FIG. 2A respectively in different embodiments of the present invention.

Figure 2B:
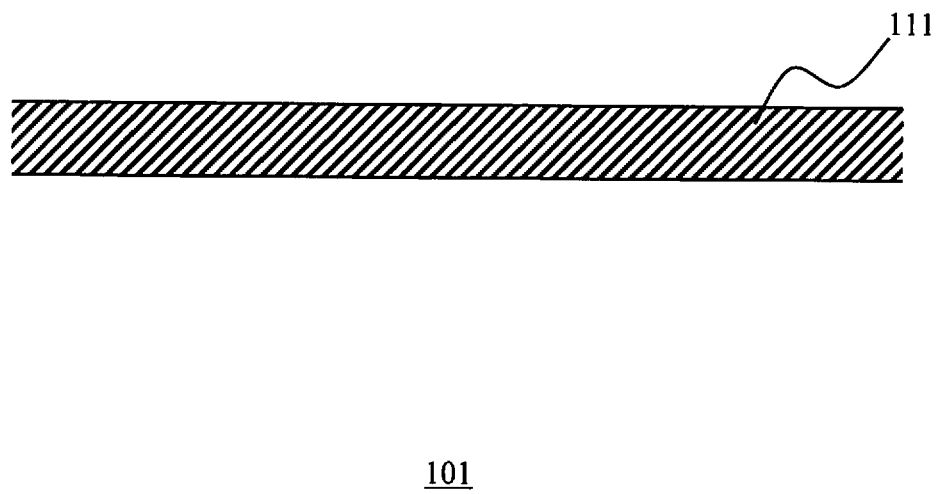

As shown in FIG. 2A, a plurality of trenches 120 are formed on a semiconductor substrate 101 with each trench 120 having a trench endpoint sidewall 110. The plurality of trenches 120 can be formed as follow: an oxide hard mask 111 is deposited atop the semiconductor substrate as shown in FIG. 2B; then the hard mask 111 is patterned according to a pre-determined configuration similar as the that shown in FIG. 2A; and the semiconductor substrate 101 is then anisotropically etched out through the patterned hard mask 111 to form the a plurality of trenches 120 with each trench 120 having trench endpoints 110 as shown in FIGS. 2C-1 and 2C-2.

Figures 1, 2C:
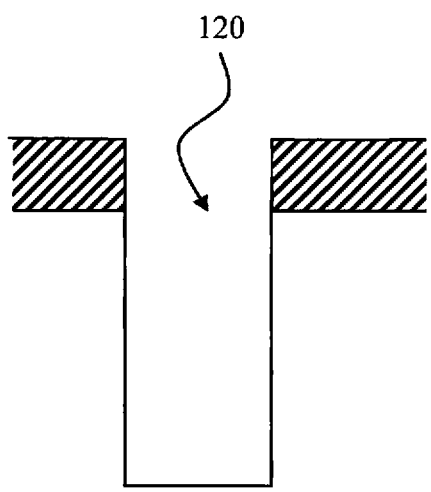
Figures 2, 2C:
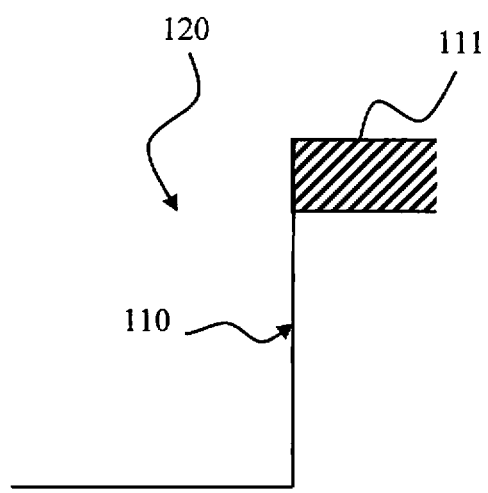

A vertical high energy P-type dopant implantation (zero degrees) is first carried out, through the patterned hard mask 111, to form the P-type dopant regions 130 below the bottom surface of the trench 120 as shown in FIGS. 2D-1 and 2D-2. The P-type dopant regions 130 function as RESURF at trench bottom for providing a maximum BV (break down voltage) blocking capability.

Figures 1, 2E:
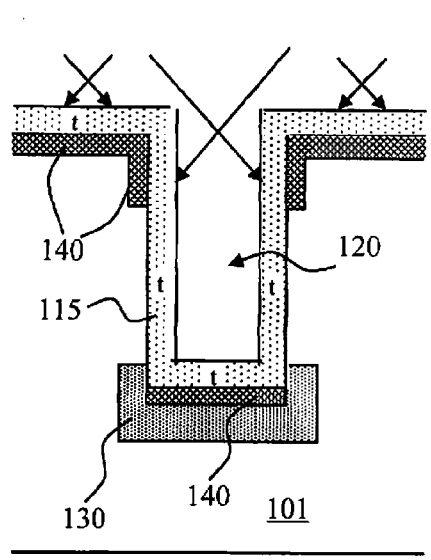
Figures 2, 2E:
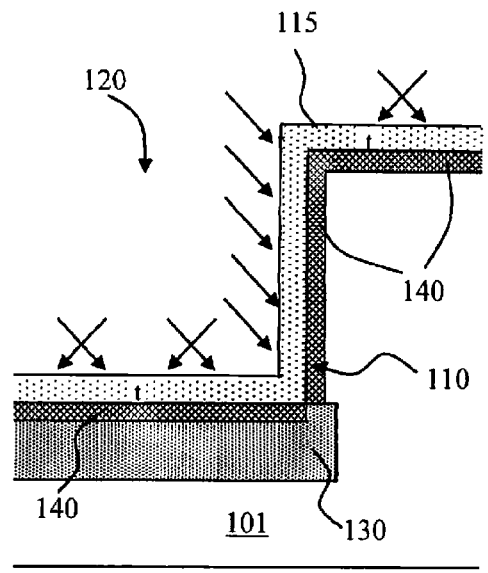

As shown in FIGS. 2E-1 and 2E-2, the hard mask 111 is removed and then a thin oxide layer 115 is deposited on the top surface of the substrate 101, on the sidewalls and the bottom surface of the trench 120 and at the endpoint sidewall 110 with a same thickness shown as t. Then a low energy tilt P-type dopant implantation, for example at 45 degrees, is carried out. In FIG. 2E-1, the P-type dopant regions 140 are formed at the top surface of the substrate, below the bottom surface of the trench 120 and only at the top portions surrounding the trench sidewalls. In FIG. 2E-2, the tilt implantation is also carried out at the endpoint sidewall 110 at the endpoints of the trenches 120, thus the P-type dopant regions 140 are now formed along the entire length of the trench endpoint sidewalls 110, below the bottom surface of the trench 120 and at the top surface of the substrate 101. The PCOMP structural configurations is achieved with the P-type dopant regions 140 formed along the entire length of the trench endpoint sidewalls 110 that link the P-body regions (not shown) to the bottom P-type dopant regions 130 without requiring additional implant mask and without requiring a high energy implantation. The manufacturing process proceeds with standard processing steps to complete the devices.

Figures 1, 2F:
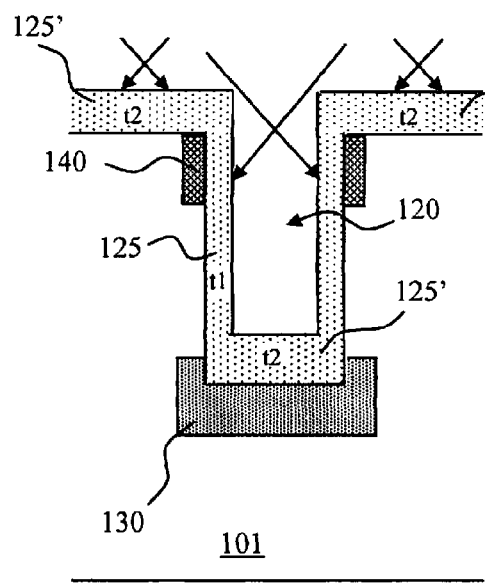
Figures 2, 2F:
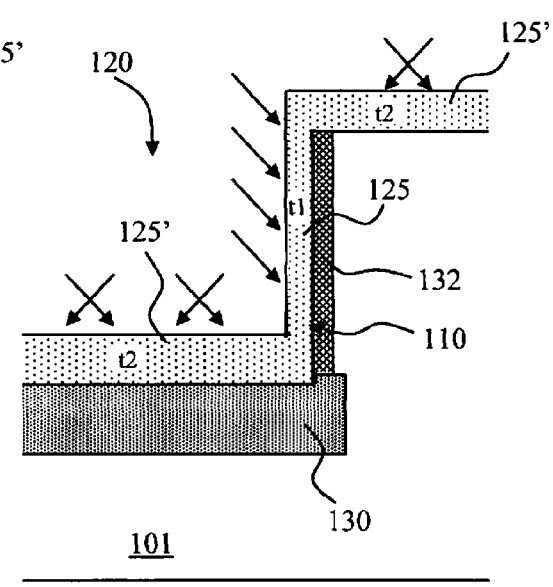

In FIGS. 2E-1 and 2E-2, as described above, a thin oxide layer 115 with a uniform thickness t is deposited on the top surface of the substrate 101 and on the sidewalls and the bottom surface of the trench 120 and the endpoint sidewall 110. FIGS. 2F-1 and 2F-2 are side cross sectional views similar to that of FIGS. 2E-1 and 2E-2. In this embodiment, the oxide layer 125' deposited at the top surface of the substrate 101 and at the bottom surface of the trench 120 has a thickness t2 greater than the thickness t1 of the oxide layer 125 covering the sidewalls of the trench 120 and the trench endpoint sidewall 110. The thickness t2 of the oxide layer 125' is thick enough to block the implantation at the top surface of the substrate 101 and below the bottom surface of the trench 120. As a result, after the low energy tilt angle implantation is carried out, as shown in FIG. 2F-1, the P-type dopant regions 140 are only formed at the top portions surrounding the sidewalls of the trenches 120. In FIG. 2F-2, the P dopant regions 140 are only formed along the entire length of the trench endpoint sidewalls 110. As such, the PCOMP structural configurations is achieved with the dopant regions 140 formed along the entire length of the trench endpoint sidewalls 110 that links the P-type body regions formed at the top surface of the semiconductor substrate (not shown) to the bottom P-type dopant regions 130 without requiring an additional implant mask and without requiring a high energy implantation. The manufacturing process proceeds with standard processing steps to complete the devices.

In an alternative embodiment, if a thin oxide layer 115 with a uniform thickness t is deposited on the top surface of the substrate 101 and on the sidewalls and the bottom surface of the trenches 120 and the endpoint sidewall 110 similar to that shown in FIGS. 2E-1 and 2E-2, to prevent the tilted implantation punching through the oxide layer at the bottom of the trench 120, before the tilted implantation is carried out, a layer of sacrificial materials 142 is deposited at the bottom of the trench 120 in certain controlled thickness as shown in FIGS. 2G-1 and 2G-2. The layer 142 can be high-density plasma (HDP) oxide photoresist, TEOS and the likes. As a result, after the low energy tilt angle implantation is carried out, as shown in FIG. 2G-1, the P-type dopant regions 140 are only formed at the top portions surrounding the sidewalls of the trenches 120 and at the top surface of the semiconductor substrate 101, and in FIG. 2G-2, the P dopant regions 140 are only formed along the entire length of the trench endpoint sidewalls 110 and at the top surface of the semiconductor substrate 101. The sacrificial material layer 142 is then removed as shown in FIGS. 2H-1 and 2H-2 before the trench 120 is filled with polysilicon in a next processing step. The manufacturing process proceeds with standard processing steps to complete the devices.

FIGS. 3A-3B show an alternative embodiment of the present invention. As shown in FIG. 3A, which is a top view of an alternate trench configuration on a semiconductor substrate 101 of the present invention, the length of the trenches 120' are adjusted by providing trench endpoints at predesigned areas, for example the length of trenches 120' is shorter than that of trenches 120 shown in FIG. 2A, thus the density of the trench endpoint sidewalls 110' and so as the density of the PCOMP structural configurations is adjusted, thus the PCOMP structural configurations with the P-type dopant regions formed along the entire length of the trench endpoint sidewalls that links between the P-type body regions formed at the top surface of the semiconductor substrate to the trench bottom P-type dopant regions are distributed over entire area of the semiconductor substrate. FIG. 3B is a top view of the semiconductor substrate 101 after the implantation is carried out using the implantation processes described above forming PCOMP structural configurations. As shown in FIG. 3B, the vertical implantation of the P-type dopant through the trench hard mask forms the P-type dopant regions 130 below the bottom surface of the trench 120' and the tilt angle P-type dopant implantation at the trench endpoint sidewalls 110' forms the P-type dopant regions 140 along the entire length of the trench endpoint sidewalk 110'. Depending on the space between two endpoints of two adjacent trenches 120', the P-type dopant regions 140 can be merged together, as shown in FIG. 3B, or can be separated from each other (not shown).

FIGS. 4A - 4B show an alternative embodiment of the present invention. As shown in FIG. 4A, which is a top view of an alternate trench configuration on a semiconductor substrate 101 of the present invention, each trench 200 has a nonlinear portion comprising small bends 210 at predesigned areas thus forming trench sidewalls 220 oriented along a direction nonlinear with the trench longitudinal direction. In the bends 210 shown in FIG. 4A, the trench sidewalls 220 are perpendicular to the longitudinal direction of the trench 200. Therefore, the entire vertical length of the sidewall 220 is exposed to dopant ions projected along a trench longitudinal direction with a tilted angle in a tilted ion implant. Therefore, the tilted ion implant may be performed with low energy dopant ions to reach the bottom of the trench sidewalls 220 since the entire vertical length of the trench sidewalls is exposed. FIG. 4B is a top view of the semiconductor substrate 101 after the implantation is carried out using the implantation processes described above forming PCOMP structural configurations. As shown in FIG. 4B, the vertical implantation of the P-type dopant through the trench hard mask forms the P-type dopant regions 130 below the bottom surface of the trench 200 and the tilt angle P-type dopant implantation at the trench sidewalls 220 of the bends 210 and the trench endpoint sidewalls 110 forms the P-type dopant regions 140 along the entire length of the trench sidewalls 220 and the endpoint sidewalls 110.

Figures 5A, 5B:
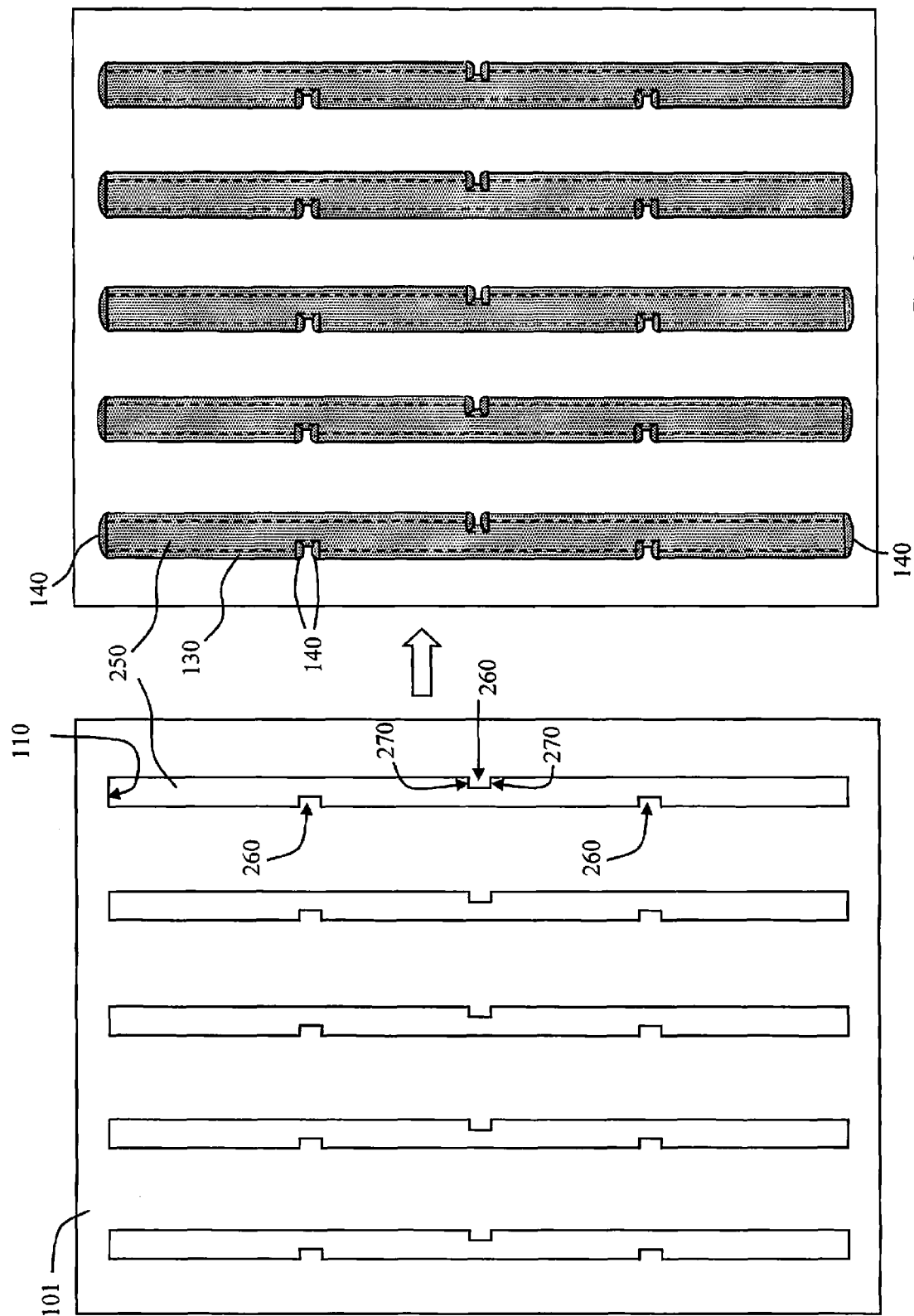
FIG. 5A is a top view of another alternate configuration of trenches on a semiconductor substrate where the trench has a nonlinear portion comprising small notches according to an embodiment of this invention.
FIG. 5B is a top view of the semiconductor substrate of FIG. 5A after the vertical and tilt implantations to form a PCOMP configuration.

FIGS. 5A-5B show an alternative embodiment of the present invention. As shown in FIG. 5A, which is a top view of an alternate trench configuration on a semiconductor substrate 101 of the present invention, each trench 250 has a nonlinear portion comprising small notches 260 at predesigned areas, thus forming trench sidewalls 270 oriented along a direction nonlinear with the trench longitudinal direction. In the notches 260 shown in FIG. 5A, the trench sidewalls 270 are perpendicular to the longitudinal direction of the trench 250. Therefore, the entire vertical length of the sidewall 270 is exposed to dopant ions projected along a trench longitudinal direction with a tilted angle in a tilted ion implant. Therefore, the tilted ion implant may be performed with low energy dopant ions to reach the bottom of the trench sidewalls 270 since the entire vertical length of the trench sidewalls is exposed. FIG. 5B is a top view of the semiconductor substrate 101 after the implantation is carried out using the implantation processes described above forming PCOMP structural configurations. As shown in FIG. 5B, the vertical implantation of the P-type dopant through the trench hard mask forms the P-type dopant regions 130 below the bottom surface of the trench 250 and the tilt angle P-type dopant implantation at the trench sidewalls 270 of the notches 260 and the trench endpoint sidewalls 110 forms the P-type dopant regions 140 along the entire length of the trench 220 and the endpoint sidewalls 110.

In general, the alternate trench configuration as shown in FIGS. 4A, 4B, and 5A, 5B can be further implemented by forming the trenches to comprise a portion at specific areas with either shrunken or enlarged widths. The portion of trenches in these areas thus forming trench sidewall oriented along a direction perpendicular to the longitudinal direction of the trench thus exposing an entire vertical length of the sidewalls to allow implanting ions to penetrate to entire vertical depth of the sidewalls without requiring a high energy ion implantation in forming the PCOMP structural configurations. Furthermore, the alternate trench configuration may also be implemented by forming the trenches with a lateral bending configuration thus exposing trench sidewalls available for full vertical depth implantation in forming the PCOMP structural configurations without requiring a high energy ion implantation.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

The invention claimed is:

1. A method for manufacturing a semiconductor power device on a semiconductor substrate comprising:
   depositing a hard mask atop the semiconductor substrate and patterning the hard mask according to a predetermined trench configuration;
   etching the semiconductor substrate through the patterned hard mask to form a plurality of trenches in the semiconductor substrate along a longitudinal direction having trench sidewalls along the longitudinal direction and forming in at least one of the trenches a laterally bend to form a laterally bend trench sidewall that extends laterally along a nonlinear direction relative to the longitudinal direction thus exposing an entire vertical length of the laterally bend trench sidewall facing the longitudinal direction;
   applying a vertical high energy implant to form trench bottom dopant regions below trench bottom surfaces and also forming an upper partial sidewall dopant region disposed on an upper portion of the trench sidewalls along the longitudinal direction followed by removing the hard mask;
   depositing an insulation layer for covering the trench sidewalls and an insulation layer for covering the trench bottom surfaces; and
   applying a low energy tilt implant along the longitudinal direction of the trenches to implant to the laterally bend trench sidewall to form a sidewall dopant region along the entire vertical length of the laterally bend trench sidewall while maintaining the upper partial dopant region disposed on the upper portion of the trench sidewalls along the longitudinal direction at a distance above the trench bottom surfaces.

2. The method of claim 1 wherein:
   the step of forming the laterally bend trench sidewall further comprises a step of forming trench sidewall that extends laterally along a perpendicular direction relative to the longitudinal direction.

3. The method of claim 1 wherein:
   the step of forming the insulation layer for covering the trench sidewalls and forming the insulation layer for covering the trench bottom surfaces comprises a step of forming the insulation layers of approximately a same thickness.

4. The method of claim 1 wherein:
   the step of forming the insulation layer for covering the trench sidewalls and forming the insulation layer for covering the trench bottom surfaces comprises a step of forming the insulation layer covering the trench sidewalls with a smaller layer thickness than the insulation layer covering the trench bottom surfaces.

5. The method of claim 1 wherein:
the step of forming the laterally bend trench sidewall further comprising a step of forming the laterally bend trench sidewall distributed at designated locations on the entire area of the semiconductor substrate.

6. The method of claim 1 further comprising:
manufacturing the semiconductor power device as a high voltage (HV) MOSFET device.

7. The method of claim 1 further comprising:
manufacturing the semiconductor power device as a high voltage (HV) IGBT device.

8. The method of claim 1 wherein:
the step of forming the laterally bend trench sidewall further comprising a step of forming in at least one of the trenches to have at least two laterally bend trench sidewalls.

9. A method of implanting ions to an entire vertical length of a trench sidewall of a trench opened in a semiconductor substrate comprising:
open the trench in the semiconductor substrate laterally along a longitudinal direction having trench sidewalls along the longitudinal direction and forming in the trench to have a laterally bend for forming a laterally bend trench sidewall that extends laterally along a nonlinear direction relative to the longitudinal direction wherein the laterally bend trench sidewall is oriented to have an entire vertical length exposed in facing the longitudinal direction for directly implanting ions to the laterally bend trench sidewall along the longitudinal direction.

10. A method of implanting ions to an entire vertical length of a trench sidewall of a trench opened in a semiconductor substrate comprising:
open the trench in the semiconductor substrate laterally along a longitudinal direction having trench sidewalls along the longitudinal direction and forming in the trench to have a laterally notch for forming a laterally notch trench sidewall that extends laterally along a nonlinear direction relative to the longitudinal direction wherein the laterally notch trench sidewall is oriented to have an entire vertical length exposed in facing the longitudinal direction for directly implanting ions to the laterally notch trench sidewall along the longitudinal direction.

11. A method for manufacturing a semiconductor power device on a semiconductor substrate comprising:
depositing a hard mask atop the semiconductor substrate and patterning the hard mask according to a predetermined trench configuration;
etching the semiconductor substrate through the patterned hard mask to form a plurality of trenches in the semiconductor substrate along a longitudinal direction having trench sidewalls along the longitudinal direction and forming in at least one of the trenches a laterally notch to form a laterally notch trench sidewall that extends laterally along a nonlinear direction relative to the longitudinal direction thus exposing an entire vertical length of the laterally notch trench sidewall facing the longitudinal direction;
applying a vertical high energy implant to form trench bottom dopant regions below a trench bottom surface and also forming upper partial sidewall dopant region disposed on an upper portion of the trench sidewalls along the longitudinal direction followed by removing the hard mask;
depositing an insulation layer for covering trench sidewalls and an insulation layer for covering the trench bottom surfaces; and
applying a low energy tilt implant along the longitudinal direction of the trenches to implant to the laterally notch trench sidewall to form a sidewall dopant region along the entire vertical length of the laterally notch trench sidewall while maintaining the upper partial dopant region disposed on the upper portion of the trenches sidewalls along the longitudinal direction at a distance above the trench bottom surfaces.

12. The method of claim 11 wherein:
the step of forming the notch sidewall further comprises a step of forming a trench notch having a shrunken trench width to form a laterally notch trench sidewall that extends laterally along a perpendicular direction relative to the longitudinal direction.

13. The method of claim 11 wherein:
the step of forming the insulation layer for covering the trench sidewalls and forming the insulation layer for covering the trench bottom surfaces comprises a step of forming the insulation layers to have approximately a same thickness.

14. The method of claim 11 wherein:
the step of forming the insulation layer for covering the trench sidewalls and forming the insulation layer for covering the trench bottom surfaces comprises a step of forming the insulation layer covering the trench sidewalls with a smaller layer thickness than the insulation layer covering the trench bottom surfaces.

15. The method of claim 11 wherein:
the step of forming the laterally notch trench sidewall further comprising a step of forming the laterally notch trench sidewall distributed at designated locations on the entire area of the semiconductor substrate.

16. The method of claim 11 further comprising:
manufacturing the semiconductor power device as a high voltage (HV) MOSFET device.

17. The method of claim 11 further comprising:
manufacturing the semiconductor power device as a high voltage (HV) IGBT device.

18. The method of claim 11 wherein:
the step of forming the laterally notch trench sidewall further comprising a step of forming in at least one of the trenches to have at least two laterally notch trench sidewalls.

* * * * *